US011056614B2

(12) United States Patent
Lai et al.

(10) Patent No.: US 11,056,614 B2
(45) Date of Patent: Jul. 6, 2021

(54) MICRO LIGHT-EMITTING DIODE CHIP

(71) Applicant: PlayNitride Inc., Hsinchu County (TW)

(72) Inventors: Yu-Hung Lai, Hsinchu County (TW); Yu-Yun Lo, Hsinchu County (TW); Tzu-Yang Lin, Hsinchu County (TW)

(73) Assignee: PlayNitride Inc., Hsinchu County (TW)

( * ) Notice: Subject to any disclaimer, the term of this patent is extended or adjusted under 35 U.S.C. 154(b) by 75 days.

(21) Appl. No.: 16/676,450

(22) Filed: Nov. 7, 2019

(65) Prior Publication Data

US 2020/0075805 A1 Mar. 5, 2020

Related U.S. Application Data

(63) Continuation-in-part of application No. 15/865,286, filed on Jan. 9, 2018, now Pat. No. 10,522,712.

(30) Foreign Application Priority Data

Jan. 10, 2017 (TW) ................................ 106100682

(51) Int. Cl.
*H01L 33/14* (2010.01)
*H01L 25/075* (2006.01)
(Continued)

(52) U.S. Cl.
CPC .......... *H01L 33/14* (2013.01); *H01L 25/0753* (2013.01); *H01L 33/22* (2013.01); *H01L 33/385* (2013.01)

(58) Field of Classification Search
CPC ....... H01L 33/14; H01L 33/22; H01L 33/385; H01L 25/0753
See application file for complete search history.

(56) References Cited

U.S. PATENT DOCUMENTS

2012/0299465 A1* 11/2012 Toyota .................. H01L 33/382 313/498
2016/0204305 A1* 7/2016 Chiu .................. H01L 25/0753 257/94

FOREIGN PATENT DOCUMENTS

CN H11330559 11/1999
CN 102751406 10/2012
(Continued)

OTHER PUBLICATIONS

"Office Action of China Counterpart Application", dated Mar. 31, 2020, p. 1-p. 6.
(Continued)

*Primary Examiner* — Mark W Tornow
(74) *Attorney, Agent, or Firm* — JCIPRNET

(57) ABSTRACT

A micro light-emitting diode chip includes an epitaxial structure, a first electrode, and a second electrode. The epitaxial structure includes a first type doped semiconductor layer, a light emitting layer, and a second type doped semiconductor layer, and the epitaxial structure further includes a first surface, a side surface and a second surface opposite to the first surface. The side surface of the epitaxial structure connects to an outer edge of the first surface and an outer edge of the second surface. The first electrode is disposed on the first surface, and is electrically connected to the first type doped semiconductor layer and contacts the first type doped semiconductor layer on a portion of the first surface. The second electrode is disposed on and surrounds the side surface, and electrically connected to the second type doped semiconductor layer, and directly contacts the second type doped semiconductor layer on a portion of the side surface. A length of a diagonal of the micro light-emitting diode chip is greater than 1 micrometer and is less than or equal to 140 micrometers, and a thickness of the
(Continued)

micro light-emitting diode chip is great than 1 micrometer and is less than 10 micrometers.

16 Claims, 7 Drawing Sheets

(51) Int. Cl.
*H01L 33/38* (2010.01)
*H01L 33/22* (2010.01)

(56) References Cited

FOREIGN PATENT DOCUMENTS

| | | |
|---|---|---|
| CN | 103996772 | 8/2014 |
| CN | 104143598 | 11/2014 |
| CN | 106025003 | 10/2016 |

OTHER PUBLICATIONS

"Office Action of China Counterpart Application", dated Sep. 4, 2019, p. 1-p. 6.

* cited by examiner

MICRO LIGHT-EMITTING DIODE CHIP

CROSS-REFERENCE TO RELATED APPLICATION

This application is a continuation-in-part application of and claims the priority benefit of U.S. application Ser. No. 15/865,286, filed on Jan. 9, 2018, now allowed, which claims the priority benefit of Taiwan application serial no. 106100682, filed on Jan. 10, 2017. The entirety of each of the above-mentioned patent applications is hereby incorporated by reference herein and made a part of this specification.

BACKGROUND OF THE INVENTION

1. Field of the Invention

The present invention relates to a light-emitting diode chip, and in particular, to a micro light-emitting diode chip.

2. Description of Related Art

With development of photovoltaic technologies, sizes of many photoelectric elements gradually become miniaturized. In recent years, because of breakthrough of a light-emitting diode ((Light-Emitting Diode, LED) in manufacturing sizes, currently, a micro light-emitting diode (micro-LED) display manufactured by arranging light-emitting diodes in arrays is gradually taken more seriously in the market. A micro light-emitting diode display is a self-luminous display, and, in addition to saving more power as compared with an organic light-emitting diode (Organic Light-Emitting Diode, OLED) display, has better contrast performances and is visible in the sun. In addition, because a micro light-emitting diode display uses an inorganic material, the micro light-emitting diode display has better reliability and a longer service life as compared with an organic light-emitting diode display.

In a structure of a common lateral light-emitting diode chip, a manner for connecting an N type doped semiconductor layer and an N type electrode is usually manufacturing contact hole penetrating through a P type doped semiconductor layer and a light emitting layer and exposing the N type electrode, and the N type electrode connects the N type doped semiconductor layer through the contact hole. However, the contact hole will diminish the light emitting area. A reason lies in that a hole corresponding to a micro light-emitting diode chip with a small size is relatively small. Therefore, a precise manufacturing process related to bonding alignment or hole digging is needed, and the process cost will raise. Consequently, a micro light-emitting diode chip is limited in a manufacture procedure thereof and is not easy to manufacture.

SUMMARY OF THE INVENTION

The present invention provides a micro light-emitting diode chip, which is relatively easy to manufacture and has a relatively great light emitting area ratio.

The micro light-emitting diode chip of the present invention includes an epitaxial structure, a first electrode, and a second electrode. The epitaxial structure includes a first type doped semiconductor layer, a light emitting layer, and a second type doped semiconductor layer, and the light emitting layer is located between the first type doped semiconductor layer and the second type doped semiconductor layer.

The epitaxial structure includes a first surface, a side surface and a second surface opposite to the first surface. The side surface of the epitaxial structure connects to an outer edge of the first surface and an outer edge of the second surface. The first electrode is disposed on the first surface, and is electrically connected to the first type doped semiconductor layer and contacts the first type doped semiconductor layer on a portion of the first surface. The second electrode is disposed and surrounds the side surface and electrically connected to the second type doped semiconductor layer and directly contacts the second type doped semiconductor layer on a portion of the side surface. The normal vector of the first surface is different from the normal vector of the side surface. A length of a diagonal of the micro light-emitting diode chip is greater than 1 micrometer and is less than or equal to 140 micrometers, and a thickness of the micro light-emitting diode chip is great than 1 micrometer and is less than 10 micrometers.

In an embodiment of the present invention, the side surface of the epitaxial structure includes a side surface of the first type doped semiconductor layer, a side surface of the light emitting layer, and a side surface of the second type doped semiconductor layer, and the second electrode is in contact with the side surface of the second type doped semiconductor layer.

In an embodiment of the present invention, the micro light-emitting diode chip further includes an insulating layer, disposed on the first surface and part of the side surface, wherein the insulating layer includes an opening to expose the first type doped semiconductor layer.

In an embodiment of the present invention, the insulating layer is configured to electrically isolate the first type doped semiconductor layer and the second electrode, and electrically isolate the light emitting layer and the second electrode.

In an embodiment of the present invention, a ratio of a width of the light emitting layer to a width of the second surface is greater than 0.9 and is less than or equal to 1.

In an embodiment of the present invention, the epitaxial structure is in the shape of cylinder.

The present invention provides a micro light-emitting diode chip display includes a circuit board and a plurality of aforementioned micro light-emitting diode chips bonded to the circuit board, wherein the first surface faces to the circuit board.

In an embodiment of the present invention, each of the plurality of micro light-emitting diode chips further includes an insulating layer disposed on the first surface and part of the side surface, wherein the insulating layer includes an opening to expose the first type doped semiconductor layer.

In an embodiment of the present invention, the insulating layer is configured to electrically isolate the first type doped semiconductor layer and the second electrode, and electrically isolate the light emitting layer and the second electrode.

In an embodiment of the present invention, a ratio of a width of the light emitting layer to a width of the second surface is greater than 0.9 and is less than or equal to 1.

In an embodiment of the present invention, the epitaxial structure is in the shape of cylinder.

In an embodiment of the present invention, the circuit board includes a plurality of pixel electrodes and a plurality of common electrodes, the first electrode is bonded to one of the plurality of pixel electrodes and the second electrode is bonded to one of the plurality of common electrodes.

In an embodiment of the present invention, the micro light-emitting diode chip display further includes a conductive adhesive electrically connecting the second electrode to one of the plurality of common electrodes.

In an embodiment of the present invention, at least two of the plurality of micro light-emitting diode chips are bonded to the circuit board through the conductive adhesive.

In an embodiment of the present invention, the conductive adhesive is disposed between the at least two of the plurality of micro light-emitting diode chips and the one of the plurality of common electrodes.

In an embodiment of the present invention, the conductive adhesive is silver epoxy, or silver paste.

Based on the above, a length of a diagonal of the micro light-emitting diode chip in this embodiment of the present invention is greater than 0 and is less than or equal to 140 micrometers. The second electrode of the micro light-emitting diode chip is connected to the second type doped semiconductor layer on the side surface of the epitaxial structure and does not need to be connected to and contact the second type doped semiconductor layer on the top surface of the epitaxial structure by manufacturing holes with sizes of micrometers penetrating through the first type doped semiconductor layer and the light emitting layer. That is, in a process of manufacturing the micro light-emitting diode chip, precise manufacturing processes related to alignment and hole digging are reduced, so that the micro light-emitting diode chip is relatively easy to manufacture and has a relatively large light emitting area. In addition, because current carriers of the first type doped semiconductor layer and the second type doped semiconductor layer do not need to be respectively provided by setting on a same surface a position at which the first electrode and the second electrode contact, but the first electrode and the second electrode are respectively disposed on the top surface and the side surface of the epitaxial structure, the first electrode and the second electrode of which a jointing area is relatively large can be manufactured, to improve a subsequent manufacture procedure yield.

To make the features and advantages of the present application more obvious and easily understood, detailed descriptions are made below by using embodiments as examples and with reference to the attached accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
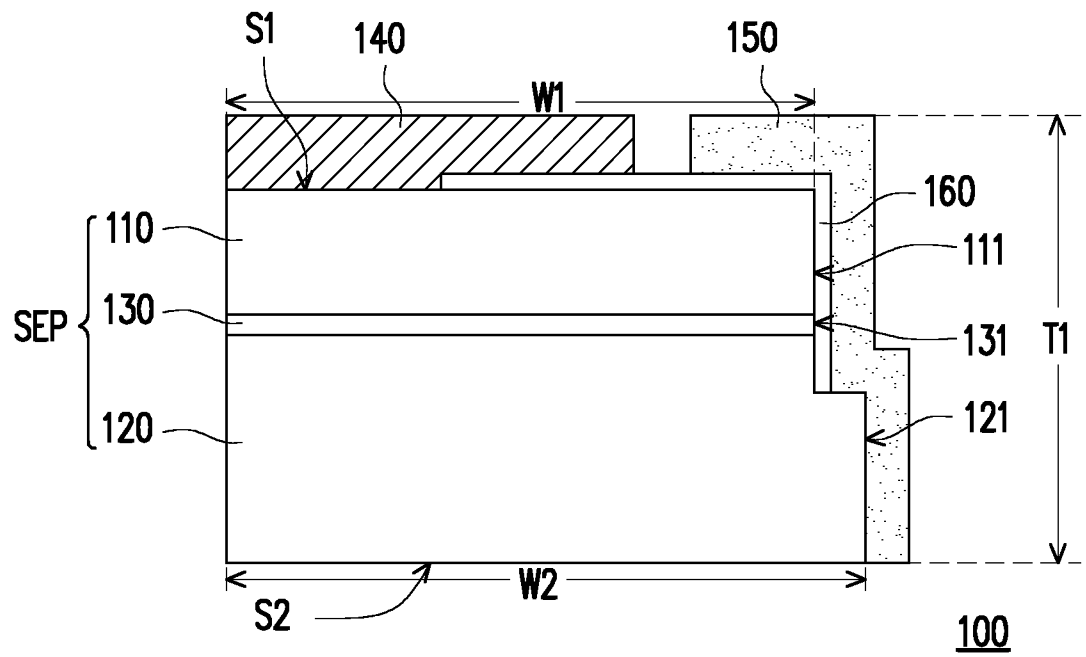
FIG. 1A is a schematic sectional view of a micro light-emitting diode chip according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a schematic sectional view of a micro light-emitting diode chip according to an embodiment of the present invention. Referring to FIG. 1A, in this embodiment, a micro light-emitting diode (μLED) chip 100 includes an epitaxial structure SEP, an insulating layer 160, a first electrode 140, and a second electrode 150. Specifically, the epitaxial structure SEP includes a first type doped semiconductor layer 110, a second type doped semiconductor layer 120, and a light emitting layer 130 located between the first type doped semiconductor layer 110 and the second type doped semiconductor layer 120. A material of the epitaxial structure SEP may be, for example, gallium nitride (GaN), indium gallium nitride (InGaN) or another semiconductor material suitable for electroluminescence. The material of the epitaxial structure SEP is not limited in the present invention. In this embodiment, the first electrode 140 is electrically connected to the first type doped semiconductor layer 110, and the second electrode 150 is electrically connected to the second type doped semiconductor layer 120. Specifically, the first electrode 140 and the second electrode 150 are configured to enable the semiconductor epitaxial structure SEP to be connected to an external circuit. For example, the micro light-emitting diode chip 100 may be electrically bonded to a circuit structure on an external circuit board through the first electrode 140 and the second electrode 150. The circuit structure on the external circuit board may provide current carriers to the epitaxial structure SEP through the first electrode 140 and the second electrode 150 to make the light emitting layer 130 of the micro light-emitting diode chip 100 emit light.

In this embodiment, the epitaxial structure SEP further includes a first surface S1 and a second surface S2 opposite the first surface S1. Specifically, film layers of the epitaxial structure SEP are constructed in sequence in a stacking manner. Therefore, the first surface S1 is a surface of the first type doped semiconductor layer 110, and the second surface S2 is a surface of the second type doped semiconductor layer 120. In more detail, the second type doped semiconductor layer 120 includes a side surface 121 extending from the second surface S2, the first type doped semiconductor layer 110 includes a side surface 111 extending from the first surface S1, and the light emitting layer 130 includes a side surface 131. That is to say, the side surface of the epitaxial structure SEP includes the side surfaces 111, 121, 131. The side surface of the epitaxial structure SEP connects to an outermost edge of the first surface S1 and an outermost edge of the second surface S2. The first surface S1 and the second surface S2 are located opposite of the light emitting layer 130 and away from each other, and the side surface 111 connects the first surface S1 at an angle, the side surface 121 connects the second surface S2 at an angle. In this embodiment, the first surface S1 and the second surface S2 are substantially parallel to each other and the side surfaces 111, 121, 131 are substantially vertical to the first surface S1.

In this embodiment, the first electrode 140 is disposed on the first surface S1 and the second electrode 150 is disposed on the first surface S1 and side surface. The second electrode 150 is in contact with the side surface 121 of the second type doped semiconductor layer 120 electrically and directly. The insulating layer 160 is disposed on the epitaxial structure SPE, and is located between the first type doped semiconductor layer 110 and the second electrode 150 and between the light emitting layer 130 and the second electrode 150. The insulating layer 160 is configured to electrically isolate the first type doped semiconductor layer 110 and the second electrode 150, and electrically isolate the light emitting layer 130 and the second electrode 150. Specifically, the insulating layer 160 covers a partial surface of the epitaxial structure SPE (for example, a portion of the first surface S1, the side surface 111 of the first type doped semiconductor layer 110 and the side surface 131 of the light emitting layer 130) and exposes the side surface 121 of second type doped semiconductor layer 120 and a portion of the first surface S1. In other words, the insulating layer 160 is disposed on the first surface S1 and extends to the side surfaces 111, 131. The first electrode 140 contacts the first type doped semiconductor layer 110 through the portion of the first surface S1 exposed by the insulating layer 160 and the second electrode 150 contacts the second type doped semiconductor layer 120 through the side surface 121 exposed by the insulating layer 160. In detail, in this embodiment, the insulating layer 160 covers partial of the first surface S1, the side surface 111, the side surface 131 and the side surface 121. The second electrode 150 is then formed on the insulating layer 160 and the side surface 121 of the second type doped semiconductor layer 120 to electrically contact the second type doped semiconductor layer 120. That is, in this embodiment, a position at which the first electrode 140 contacts and electrically connects to the first type doped semiconductor layer 110 is on the first surface S1 of the epitaxial structure SEP, and the first electrode 140 provides a first type carrier entering the epitaxial structure SEP from at least a portion of the first surface S1. A position at which the second electrode 150 contacts and electrically connects to the second type doped semiconductor layer 120 is on the side surface 121 of the second type doped semiconductor layer 120, and the second electrode 150 provides a second type carrier entering the epitaxial structure SEP from at least a portion of the side surface 121.

In this embodiment, one of the first type doped semiconductor layer 110 and the second type doped semiconductor layer 120 is a P type doped semiconductor layer, and the other one of the first type doped semiconductor layer 110 and the second type doped semiconductor layer 120 is an N type doped semiconductor layer. For example, the first type doped semiconductor layer 110 is, for example, a P type doped semiconductor layer, and the second type doped semiconductor layer 120 is, for example, an N type doped semiconductor layer. In addition, corresponding to doping type of the semiconductor layers, in this embodiment, the first electrode 140 electrically connected to the first type doped semiconductor layer 110 is, for example, an anode electrode, and the second electrode 150 electrically connected to the second type doped semiconductor layer 120 is, for example, an cathode electrode. In addition, in this embodiment, the light emitting layer 130 includes, for example, a multiple quantum well (multiple quantum well, MQW) structure or a quantum well (quantum well, QW) structure. The present invention is not limited thereto. In addition, in this embodiment, the semiconductor epitaxial structure SEP (the first type doped semiconductor layer 110, the second type doped semiconductor layer 120, and the light emitting layer 130) are, for example, formed on a growth substrate. Subsequently, after manufacturing process of the micro light-emitting diode chip 100 is completed, the growth substrate is removed by using laser (e.g. laser lift-off process) or another physical or chemical method. However, in some embodiments, the growth substrate may not be removed. The present invention is not limited thereto.

In addition, in some embodiments, the micro light-emitting diode chip 100 may be, for example, a resonant-cavity micro light-emitting diode (Resonant-Cavity Light-Emitting Diode, RCLED) chip. In these embodiments, the micro light-emitting diode chip 100 further includes distributed Bragg reflector (DBR) structures, separately disposed on two sides of the epitaxial structure SEP. By means of refractive index designs of these distributed Bragg reflector structures, after light emitting form the light emitting layer 130 is reflected between the distributed Bragg reflector structures and exits out of the micro light-emitting diode chip 100, the full width at half maximum (FWHM) of a spectrum thereof is reduced. Therefore, in these embodiments, the micro light-emitting diode chip 100 may emit light with higher color purity. Specifically, in other embodiments, light exiting performances of the micro light-emitting diode chip 100 can be adjusted by using another appropriate structural design. The present invention is not limited thereto.

Figure 1B:
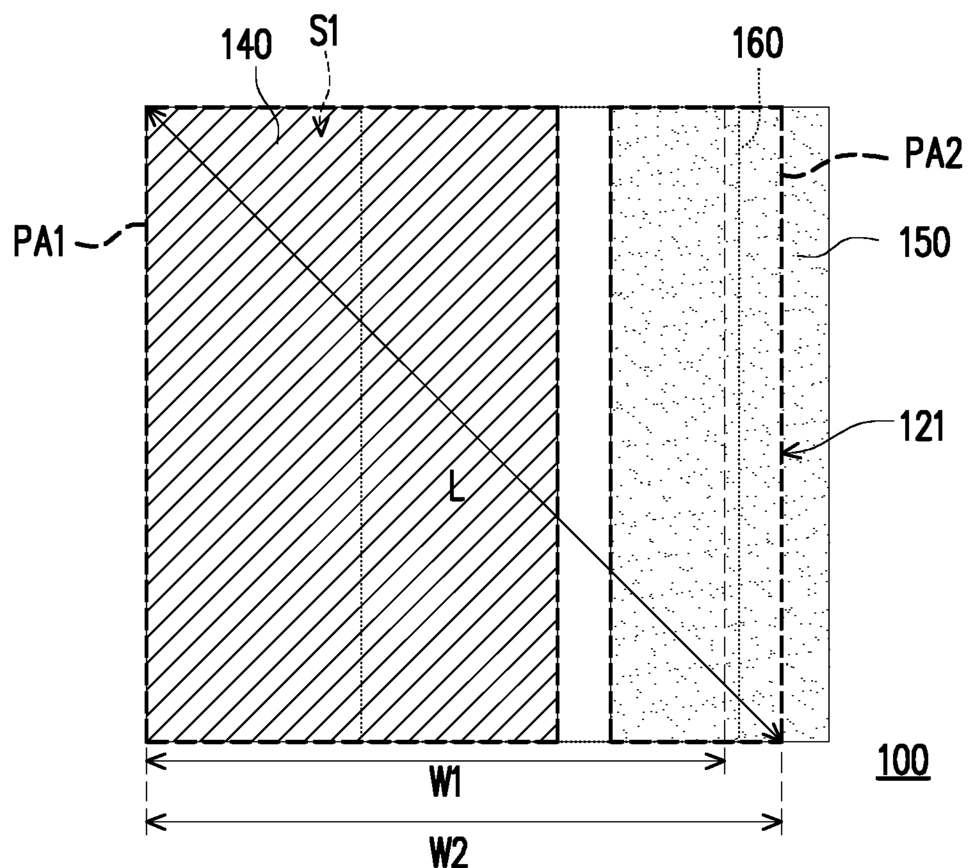
FIG. 1B is a schematic top view of the micro light-emitting diode chip according to the embodiment of FIG. 1A.

FIG. 1B is a schematic top view of the micro light-emitting diode chip according to the embodiment of FIG. 1A. Referring to both FIG. 1A and FIG. 1B, in this embodiment, a size of the micro light-emitting diode chip 100 is smaller than a common light-emitting diode chip. Specifically, a length L of a diagonal of the micro light-emitting diode chip 100 is greater than 1 micrometer and is less than or equal to 140 micrometers. In this embodiment, the diagonal length L of the micro light-emitting diode chip 100 means the diagonal length L of the second surface S2 of the epitaxial structure SEP. However, in other implementation patterns, if a second surface of an epitaxial structure is a non-rectangle, a maximum width less than 140 micrometers is used as limitation. In addition, in this embodiment, a thickness T1 of the micro light-emitting diode chip 100 is great than 1 micrometer and is less than 10 micrometers. Furthermore, in this embodiment, the first type doped semiconductor layer 110 and the light emitting layer 130 are located on the second type doped semiconductor layer 120 and a projected area of the first type doped semiconductor layer 110 on the second surface S2, a projected area of the light emitting layer 130 on the second surface S2 are smaller than an area of the second surface S2. In other words, the cross-section width W2 of the second surface S2 is larger than the cross-section width W1 of the first surface S1. In this embodiment, a ratio of the width W1 to the width W2 is, for example, greater than 0.9 and is less than or equal to 1. A ratio of a projected area of the first type doped semiconductor layer 110 on the second surface S2 to an area of the second surface S2 is greater than or equal to 0.8 and is less than or equal to 1. In addition, a projected area of the light emitting layer 130 is substantially equal to that of the first type doped semiconductor layer 110. That is, a ratio of a projected area of the light emitting layer 130 on the second surface S2 to the area of the bottom surface S2 is also greater than or equal to 0.8 and is less than or equal to 1. By means of the design, the micro light-emitting diode chip 100 of this embodiment can maintain a light emitting area with a great area proportion.

In addition, the first electrode 140 has a projected area PA1 on the second surface S2, and the second electrode 150 has a projected area PA2 on the second surface S2 (as shown in FIG. 1B). The projected area PA1 is greater than the projected area PA2. Preferably, in this embodiment, a ratio of the projected area PA1 of the first electrode 140 to the projected area PA2 of the second electrode 150 is greater than 1.5. More preferably, the ratio of the projected area PA1 of the first electrode 140 to the projected area PA2 of the second electrode 150 falls within a range of 2 to 6. Generally, when the first electrode 140 and the second electrode 150 are larger, a bonding process window will be improved, and an alignment error can be reduced. In this embodiment, although the projected area PA2 of the second electrode 150 on the second surface S2 is much less than the projected area PA1 of the first electrode 140, the second electrode 150 extends to the side surface of the epitaxial structure SEP, and the second electrode 150 and the side surface 121 of the second type doped semiconductor layer 120 have an enough contact area. Therefore, the second electrode 150 may provide sufficient current carriers to the second type doped semiconductor layer 120. Besides, the second electrode 150 also has a relatively large area. Preferably, a ratio of a contact area of the first electrode 140 and the first type doped semiconductor layer 110 and a contact area of the second electrode 150 and the second type doped semiconductor layer 120 falls within a range of 0.5 to 2.

In this embodiment, the first electrode 140 electrically contacts and is located on the first surface S1, and the second electrode 150 of the micro light-emitting diode chip 100 is located on the side surface of the epitaxial structure SEP and electrically contacts the side surface 121 of the second type doped semiconductor layer 120, so that the second electrode 150 can be directly electrically connected to the second type doped semiconductor layer 120. Furthermore, the normal vector of the first surface S1 is different from the normal vector of the side surface 121, in this embodiment, the normal vector of the first surface S1 and the normal vector of the side surface 121 are orthogonal. Therefore, the first electrode 140 in contact with the first type doped semiconductor layer 110 and the second electrode 150 in contact with the second type doped semiconductor layer 120 do not need to be disposed on a same surface (for example, the first surface S1) of the epitaxial structure SEP of the micro light-emitting diode chip 100 with a small size. The first electrode 140 and the second electrode 150 are respectively disposed on different surface of the epitaxial structure SEP. In this embodiment, the micro light-emitting diode chip 100 may have a relatively great light emitting area ratio.

Figure 2:
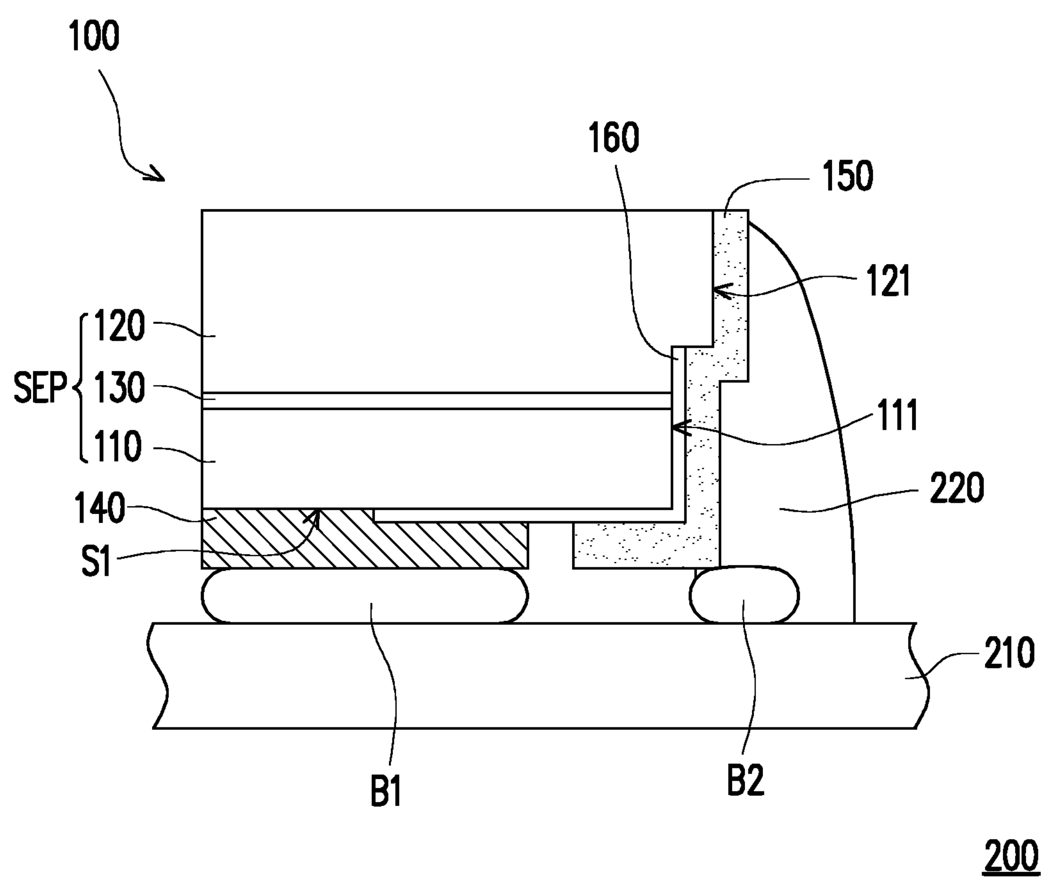
FIG. 2 is an implementation pattern for recovering jointing of the micro light-emitting diode chip in the embodiment of FIG. 1A and a back board by using a conductive adhesive.

FIG. 2 is a display 200 with the micro light-emitting diode chips 100 in the embodiment of FIG. 1A. Referring to FIG. 2, in this embodiment, the micro light-emitting diode chip 100 (just take one micro light-emitting diode chip for illustration) is bonded to the circuit board 210, and the micro light-emitting diode chip 100 is electrically connected to a circuit structure (not drawn) on the circuit board 210. In detail, the first electrode 140 and the second electrode 150 of the micro light-emitting diode chip 100 are, for example, electrically connected to the circuit board 210 respectively by using a first bump pad B1 and a second bump pad B2. The first bump pad B1 is, for example, a P type pad corresponding to the first electrode 140, and the second bump pad B2 is, for example, an N type pad corresponding to the second electrode 150. The circuit board 210 may be, for example, a semiconductor substrate, a submount substrate, a complementary metal-oxide-semiconductor (CMOS) circuit substrate, a liquid crystal on silicon (LCOS) substrate, a thin film transistor (TFT) substrate, or a substrate of another type. The present invention is not limited thereto. Specifically, the circuit board 210 in this embodiment is, for example, a thin film transistor substrate.

Generally, because the micro light-emitting diode chip 100 has a small size, when the micro light-emitting diode chip 100 is bonded to the circuit board 210, the electrodes 140, 150 of the micro light-emitting diode chip 100 is hard to align with a bump pad B1, B2 on the circuit board 210. When the second electrode 150 of the micro light-emitting diode chip 100 is not aligned with the second bump pad B2 perfectly, the micro light-emitting diode chip 100 maybe fail to emit light or has low luminous efficacy. One of repair method is, a conductive adhesive 220 may be provided to electrically connect the second electrode 150 and the second bump pad B2. Specifically, the conductive adhesive 220 may be, for example, sliver epoxy. The present invention is not limited thereto.

Figure 3:
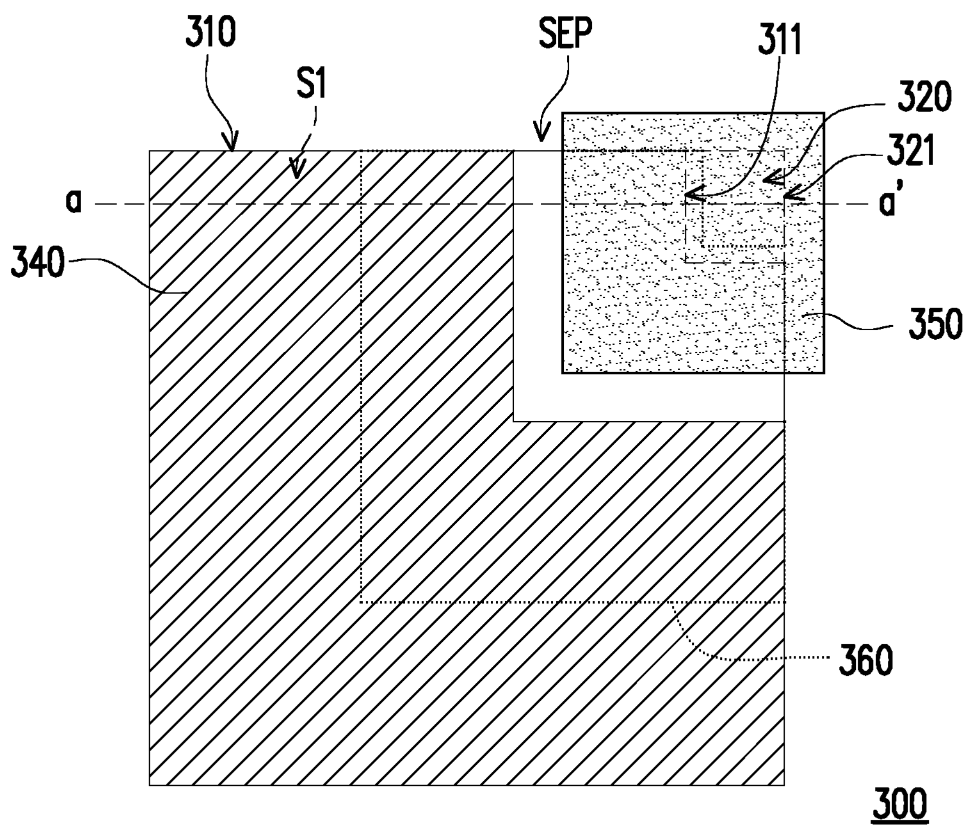
FIG. 3 is a schematic top view of a micro light-emitting diode chip according to another embodiment of the present invention.

FIG. 3 is a schematic top view of a micro light-emitting diode chip 300 according to another embodiment of the present invention. A sectional view of the micro light-emitting diode chip 300 along a sectional line a-a' is like an embodiment of FIG. 1A. The micro light-emitting diode chip 300 is like to the micro light-emitting diode chip 100 in FIG. 1A~1B, a main difference is that the electrode design and arrangement. The micro light-emitting diode chip 300 includes an epitaxial structure SEP, an insulating layer 360, a first electrode 340, and a second electrode 350. The first electrode 340 and the second electrode 350 are disposed on a first surface S1 of the epitaxial structure SEP, and the second electrode 350 extends and covers the side surface of epitaxial structure SEP including the side surface 311 of the first type doped semiconductor layer 310 and the side surface 321 of the second type doped semiconductor layer 320. The side surface 311 is an L shape when viewed from the top view. In this embodiment, the exposed area of the second type doped semiconductor layer 320 is smaller, in other words, the area of the light emitting layer becomes bigger. The insulating layer 360 also has an L shape corner, and the insulating layer 360 covers a portion of the first surface S1 of the epitaxial structure SEP and the side surface 311. The second electrode 350 is also correspondingly disposed above the insulating layer 360 to isolate from the first type doped semiconductor layer 310 and the light emitting layer 330 (not drawn). In this embodiment, a light emitting area of the micro light-emitting diode chip 300 may further be increased, and a contact area of a second electrode 350 and a second type doped semiconductor layer 320 is also maintained by means of the side surface 321.

Figure 4:
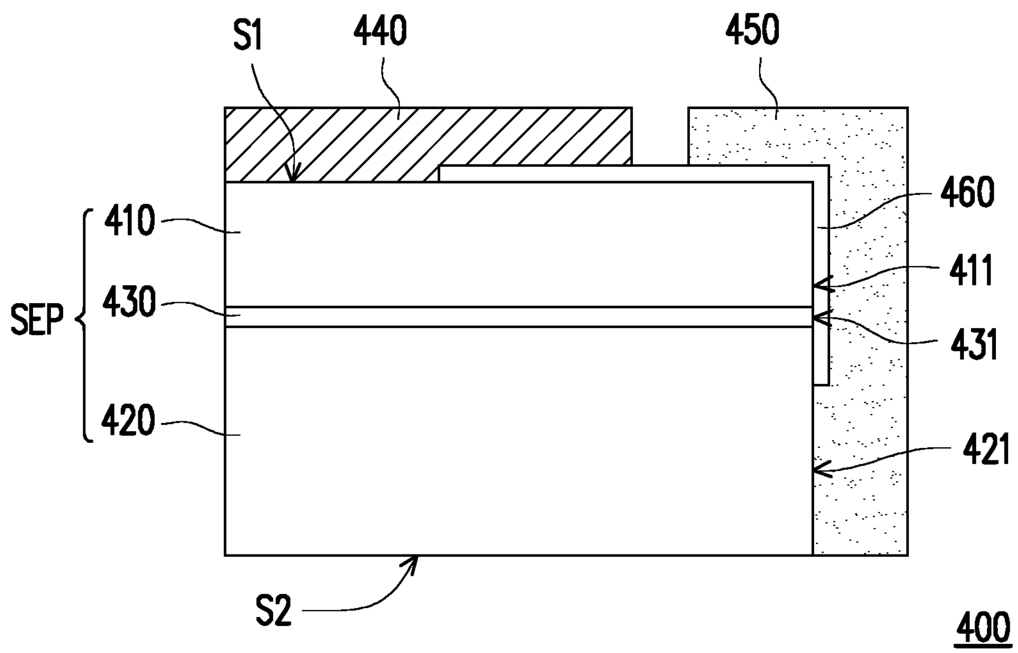
FIG. 4 is a schematic sectional view of a micro light-emitting diode chip according to still another embodiment of the present invention.

FIG. 4 is a schematic sectional view of a micro light-emitting diode chip according to still another embodiment of the present invention. A micro light-emitting diode chip 400 in this embodiment is similar to the micro light-emitting diode chip 100 in embodiments of FIG. 1A~1B. For components of the micro light-emitting diode chip 400 and related statement refer to components of the micro light-emitting diode chip 100 in embodiments of FIG. 1A to FIG. 1B and related statement. Details are not illustrated again herein. The main differences between the micro light-emitting diode chip 400 and the micro light-emitting diode chip 100 are as follows. A first type doped semiconductor layer 410, a second type doped semiconductor layer 420, and a light emitting layer 430 of the epitaxial structure SEP have substantially same areas, and the first type doped semiconductor layer 410 and the light emitting layer 430 do not need to form short corner. The side surfaces 411, 421, 431 form a continuous surface. The insulating layer 460 is disposed on the first surface S1 and extends to the side surfaces 411, 431 and partial of the side surface 421. The insulating layer 460 is disposed between the first type doped semiconductor layer 410 and a second electrode 450 to isolate the first type doped semiconductor layer 410 and the second electrode 450, and is disposed between the light emitting layer 430 and the second electrode 450 to isolate the light emitting layer 430 and the second electrode 450. In this embodiment, the insulating layer 460 does not completely cover the side surface of an epitaxial structure SEP, and a portion of the side surface 421 of the second type doped semiconductor layer 420 is exposed, so that the second electrode 450 is electrically connected to the second type doped semiconductor layer 420.

In this embodiment, because a position at which the second electrode 450 of the micro light-emitting diode chip 400 contacts electrically to the second type doped semiconductor layer 420 is on the side surface of the epitaxial structure SEP, the micro light-emitting diode chip 400 may maximize the area of the light emitting layer 430 to improve luminous efficacy.

Figure 5A:
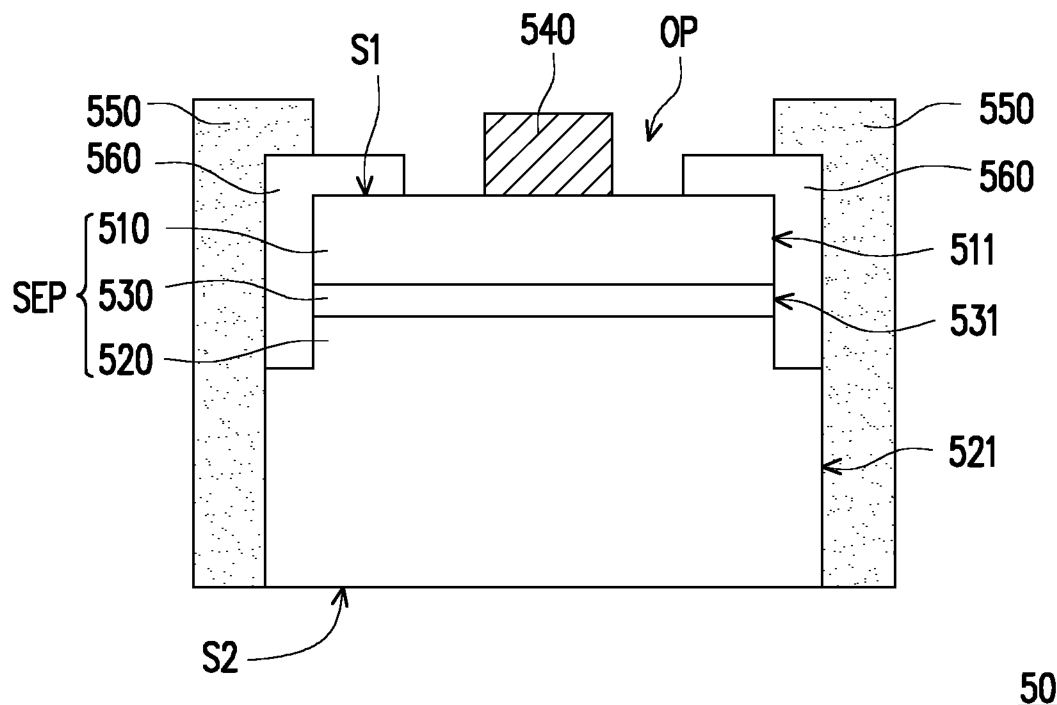
FIG. 5A is a schematic sectional view of a micro light-emitting diode chip according to still another embodiment of the present invention.
Figure 5B:
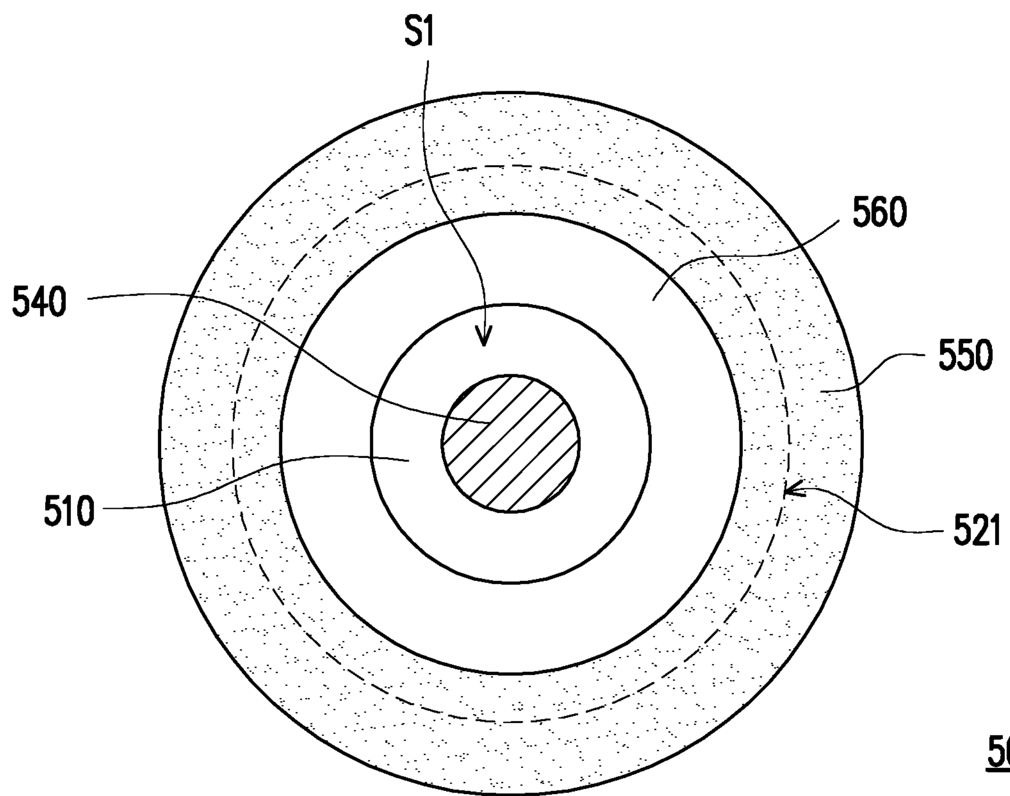
FIG. 5B is a schematic top view of the micro light-emitting diode chip according to the embodiment of FIG. 5A.

FIG. 5A is a schematic sectional view of a micro light-emitting diode chip according to still another embodiment of the present invention. FIG. 5B is a schematic top view of the micro light-emitting diode chip according to the embodiment of FIG. 5A. A micro light-emitting diode chip 500 in this embodiment is similar to the micro light-emitting diode chip 100 in embodiments of FIG. 1A~1B. For components of the micro light-emitting diode chip 500 and related statement refer to components of the micro light-emitting diode chip 100 in embodiments of FIG. 1A to FIG. 1B and related statement. Details are not illustrated again herein. The main differences between the micro light-emitting diode chip 500 and the micro light-emitting diode chip 100 are as follows. The second electrode 550 is disposed on and surrounds the side surface of the epitaxial structure SEP, is electrically connected to the second type doped semiconductor layer 520, and directly contacts the second type doped semiconductor layer 520 on a portion of the side surface. The insulating layer 560 is disposed on the first surface S1 and part of the side surface, wherein the insulating layer 560 includes an opening OP to expose the first type doped semiconductor layer 510. The first electrode 540 contacts the exposed portion of the first type doped semiconductor layer 510 in the opening OP of the insulating layer 560. In addition, the epitaxial structure SEP is in the shape of cylinder, as shown in FIG. 5B.

In this embodiment, the insulating layer 560 is disposed on the first surface S1 and extends to the side surfaces 511, 531 and partial of the side surface S21. The insulating layer 560 surrounds the first type doped semiconductor layer 510, the light emitting layer 530 and a portion of the second type doped semiconductor layer 520. The insulating layer 560 is disposed between the first type doped semiconductor layer 510 and the second electrode 550 to isolate the first type doped semiconductor layer 510 and the second electrode 550, and is disposed between the light emitting layer 530 and the second electrode 550 to isolate the light emitting layer 530 and the second electrode 550. In this embodiment, the insulating layer 560 does not completely cover the side surface of the epitaxial structure SEP, and a portion of the side surface S21 of the second type doped semiconductor layer 520 is exposed, so that the second electrode 550 is electrically connected to the second type doped semiconductor layer 520.

In this embodiment, since the second electrode 550 surrounds the side surface of the epitaxial structure SEP, a contact area of the second electrode 550 and the second type doped semiconductor layer 520 may further be increased. Therefore, the second electrode 550 may provide more sufficient current carriers to the second type doped semiconductor layer 520. Besides, the second electrode 550 also has a relatively large area.

Figure 6:
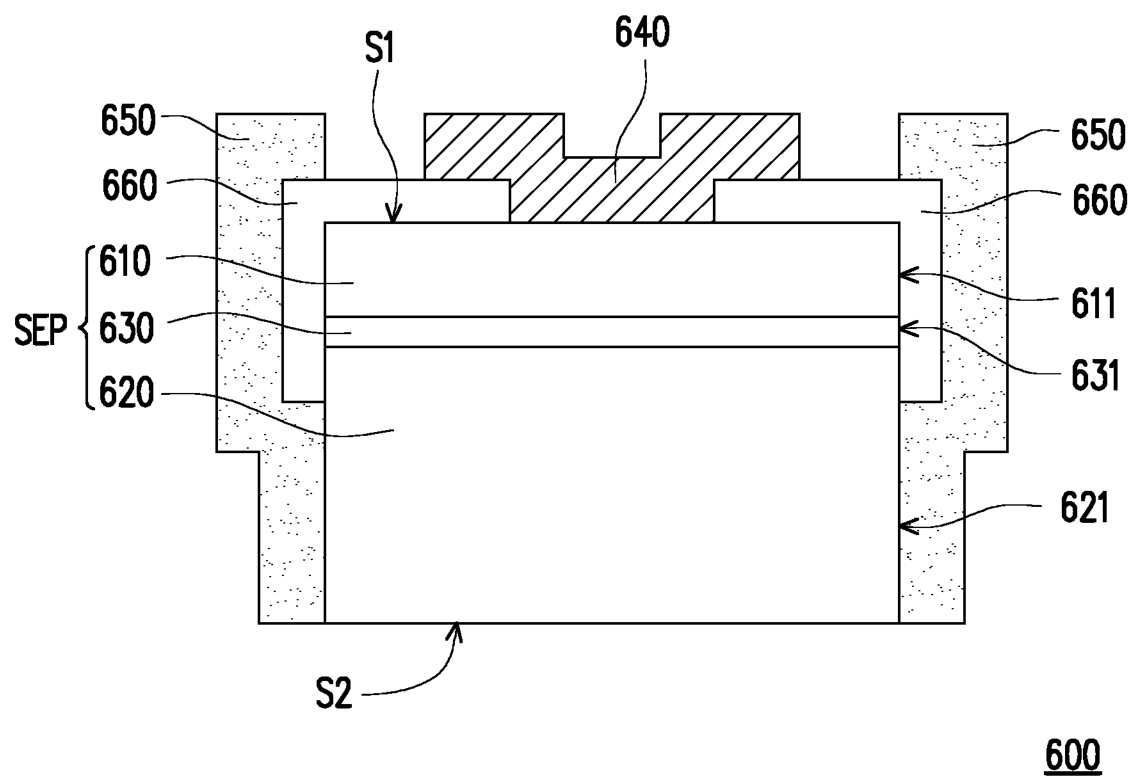
FIG. 6 is a schematic sectional view of a micro light-emitting diode chip according to still another embodiment of the present invention.

FIG. 6 is a schematic sectional view of a micro light-emitting diode chip according to still another embodiment of the present invention. A micro light-emitting diode chip 600 in this embodiment is similar to the micro light-emitting diode chip 500 in embodiments of FIG. 5A~5B. For components of the micro light-emitting diode chip 600 and related statement refer to components of the micro light-emitting diode chip 500 in embodiments of FIG. 5A to FIG. 5B and related statement. Details are not illustrated again herein. The main differences between the micro light-emitting diode chip 600 and the micro light-emitting diode chip 500 are as follows. A first type doped semiconductor layer 610, a second type doped semiconductor layer 620, and a light emitting layer 630 of the epitaxial structure SEP have substantially same areas, and the first type doped semiconductor layer 610 and the light emitting layer 630 do not need to form short corner. The side surfaces 611, 621, 631 form a continuous surface. The insulating layer 660 is disposed on the first surface S1 and extends to the side surfaces 611, 631 and partial of the side surface 621. The insulating layer 660 is disposed between the first type doped semiconductor layer 610 and a second electrode 650 to isolate the first type doped semiconductor layer 610 and the second electrode 650, and is disposed between the light emitting layer 630 and the second electrode 650 to isolate the light emitting layer 630 and the second electrode 650. In this embodiment, the insulating layer 660 does not completely cover the side surface of an epitaxial structure SEP, and a portion of the side surface 621 of the second type doped semiconductor layer 620 is exposed, so that the second electrode 650 is electrically connected to the second type doped semiconductor layer 620.

In this embodiment, because a position at which the second electrode 650 of the micro light-emitting diode chip 600 contacts electrically to the second type doped semiconductor layer 620 is on the side surface of the epitaxial structure SEP, the micro light-emitting diode chip 600 may maximize the area of the light emitting layer 630 to improve luminous efficacy.

Figure 7:
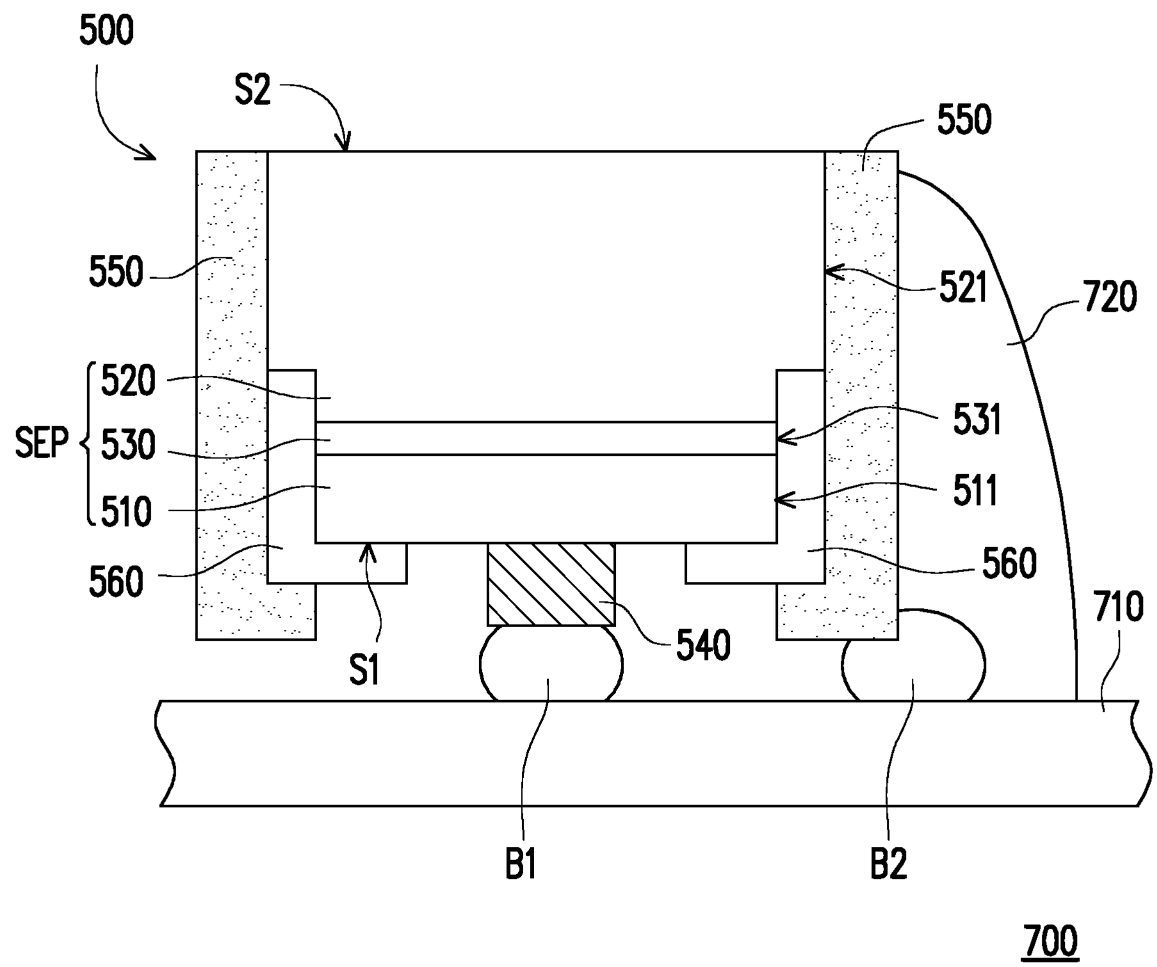
FIG. 7 is a display with the micro light-emitting diode chips in the embodiment of FIG. 5A according to some embodiments of the present invention.

FIG. 7 is a display 700 with the micro light-emitting diode chips 500 in the embodiment of FIG. 5A according to some embodiments of the present invention. The display 700 in this embodiment is similar to the display 200 in embodiments of FIG. 2. For components of the display 700 and related statement refer to components of the display 200 in embodiments of FIG. 2 and related statement. Details are not illustrated again herein. The main difference between the display 700 and the display 200 is that the micro light-emitting diode chips 100 are replaced by the micro light-emitting diode chips 500. In this embodiment, the micro light-emitting diode chip 500 (just take one micro light-emitting diode chip for illustration) is bonded to the circuit board 710, and the micro light-emitting diode chip 500 is electrically connected to a circuit structure (not drawn) on the circuit board 710. The first surface S1 of the epitaxial structure SEP faces to the circuit board 710.

In detail, the first electrode 540 and the second electrode 550 of the micro light-emitting diode chip 500 are, for example, electrically connected to the circuit board 710 respectively by using a first bump pad B1 and a second bump pad B2. The first bump pad B1 is, for example, a P type pad corresponding to the first electrode 540, and the second bump pad B2 is, for example, an N type pad corresponding to the second electrode 550. The circuit board 710 may be similar to the circuit board 210 illustrated in FIG. 2, and details are not illustrated again herein. In addition, a conductive adhesive 720 may be provided to electrically connect the second electrode 550 and the second bump pad B2. Specifically, the conductive adhesive 720 may be, for example, sliver epoxy. The present invention is not limited thereto.

It is noted that, in alternative embodiments, the display 700 may include other micro light-emitting diode chips instead of the micro light-emitting diode chips 500. For example, the display 700 may include the micro light-emitting diode chip 600 illustrated in the FIG. 6, the micro light-emitting diode chip 400 illustrated in the FIG. 4, or the micro light-emitting diode chip 300 illustrated in the FIG. 3.

Figure 8:
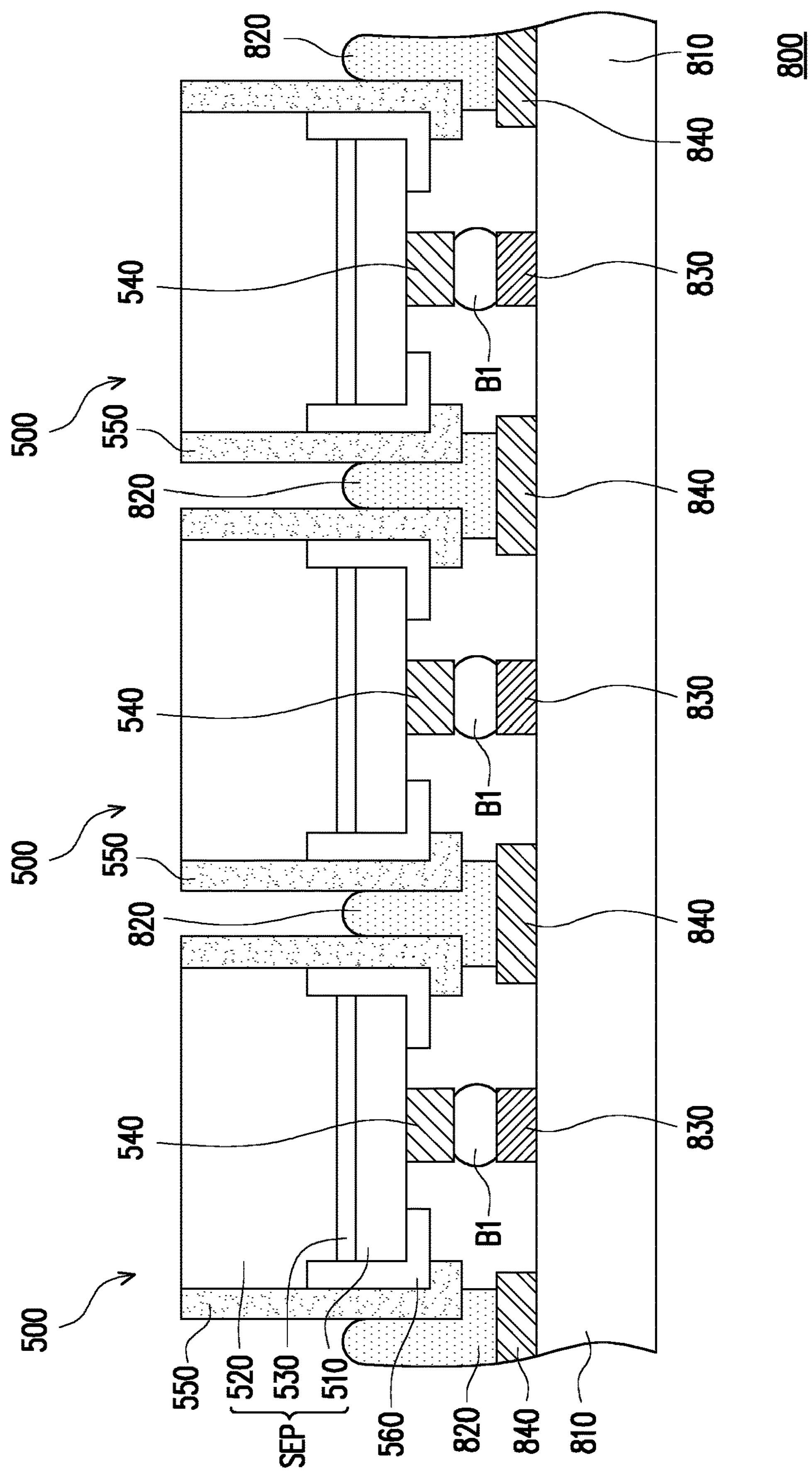
FIG. 8 is a display with the micro light-emitting diode chips in the embodiment of FIG. 5A according to other embodiments of the present invention.

FIG. 8 is a display 800 with the micro light-emitting diode chips 500 in the embodiment of FIG. 5A according to other embodiments of the present invention. The display 800 in this embodiment is similar to the display 700 in embodiments of FIG. 7. For components of the display 800 and related statement refer to components of the display 700 in embodiments of FIG. 7 and related statement. Details are not illustrated again herein. The main differences between the display 800 and the display 700 are as follows. The first electrodes 540 and the second electrodes 550 of the micro light-emitting diode chips 500 are electrically connected to the circuit board 810 respectively by using the first bump pads B1 and the conductive adhesives 820. In detail, the circuit board 810 includes a plurality of pixel electrodes 830 and a plurality of common electrodes 840. One of the first electrodes 540 is bonded to one of the pixel electrodes 830 through a corresponding first bump pad B1, and two adjacent second electrodes 550 are bonded to one of the common electrodes 840 through a corresponding conductive adhesive 820. In other words, at least two of the micro light-emitting diode chips 500 are bonded to the circuit board 810 through a common conductive adhesive 820. In this embodiment, the common conductive adhesive 820 is disposed between the at least two of the plurality of micro light-emitting diode chips 500 and one of the common electrodes 840. In addition, the conductive adhesive 820 electrically connects the second electrode 550 to one of the common electrodes 840 without a bump pad between the conductive adhesive 820 and the common electrode 840. Specifically, the conductive adhesive 820 may be, for example, sliver epoxy, or silver paste. The present invention is not limited thereto.

In this embodiment, because the second electrodes 550 on the side surfaces of the micro light-emitting diode chips 500 are connected to the common electrodes 840 through the conductive adhesive 820, when the micro light-emitting diode chips 500 are bonded to the circuit board 810, only the first bump pads B1 are needed to align with the pixel electrodes 830, and the second electrodes 550 are subsequently connected to the common electrodes 840 by applying the conductive adhesive 820. Therefore, a bonding process window will be improved, and/or a manufacturing yield will be increased.

Based on the above, a length of a diagonal of the micro light-emitting diode chip in this embodiment of the present invention is greater than 1 micrometer and is less than or equal to 140 micrometers. The second electrode of the micro light-emitting diode chip is connected to the second type doped semiconductor layer on the side surface of the epitaxial structure. The areas of the first type doped semiconductor layer and the light emitting layer keep as larger as possible. That is, in a process of manufacturing the micro light-emitting diode chip, precise manufacturing processes related to alignment and hole digging are reduced, so that the micro light-emitting diode chip is relatively easy to manufacture and has a relatively large light emitting area. In addition, because the first electrode and the second electrode are respectively disposed on different surface of the epitaxial structure (e.g. the first surface and the side surface), the first electrode and the second electrode have larger bonding areas and bonding yield will improve.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A micro light-emitting diode chip, comprising:

an epitaxial structure, comprising a first type doped semiconductor layer, a light emitting layer, and a second type doped semiconductor layer, wherein the light emitting layer is located between the first type doped semiconductor layer and the second type doped semiconductor layer, the epitaxial structure further comprises a first surface, a side surface and a second surface opposite to the first surface, and the side surface of the epitaxial structure connects to an outermost edge of the first surface and an outermost edge of the second surface;

a first electrode, disposed on the first surface and electrically connected to the first type doped semiconductor layer and contacting the first type doped semiconductor layer on a portion of the first surface; and a second electrode, disposed on and surrounding the side surface and electrically connected to the second type doped semiconductor layer and directly contacting the second type doped semiconductor layer on a portion of the side surface, wherein the normal vector of the first surface is different from the normal vector of the side surface, a length of a diagonal of the micro light-emitting diode chip is greater than 1 micrometer and is less than or equal to 140 micrometers and a thickness of the micro light-emitting diode chip is great than 1 micrometer and is less than 10 micrometers.

2. The micro light-emitting diode chip according to claim 1, wherein the side surface of the epitaxial structure includes a side surface of the first type doped semiconductor layer, a side surface of the light emitting layer, and a side surface of the second type doped semiconductor layer, and the second electrode is in contact with the side surface of the second type doped semiconductor layer.

3. The micro light-emitting diode chip according to claim 1, further comprising an insulating layer, disposed on the first surface and part of the side surface, wherein the insulating layer includes an opening to expose the first type doped semiconductor layer.

4. The micro light-emitting diode chip according to claim 3, wherein the insulating layer is configured to electrically isolate the first type doped semiconductor layer and the second electrode, and electrically isolate the light emitting layer and the second electrode.

5. The micro light-emitting diode chip according to claim 1, wherein a ratio of a width of the light emitting layer to a width of the second surface is greater than 0.9 and is less than or equal to 1.

6. The micro light-emitting diode chip according to claim 1, wherein the epitaxial structure is in the shape of cylinder.

7. A micro light-emitting diode chip display, comprising:

a circuit board; and a plurality of micro light-emitting diode chips, bonded to the circuit board, each of the plurality of micro light-emitting diode chips comprising;

an epitaxial structure, comprising a first type doped semiconductor layer, a light emitting layer, and a second type doped semiconductor layer, wherein the light emitting layer is located between the first type doped semiconductor layer and the second type doped semiconductor layer, the epitaxial structure further comprises a first surface, a side surface and a second surface opposite to the first surface, and the side surface of the epitaxial structure connects to an outermost edge of the first surface and an outermost edge of the second surface;

a first electrode, disposed on the first surface and electrically connected to the first type doped semiconductor layer and contacting the first type doped semiconductor layer on a portion of the first surface; and a second electrode, disposed on and surrounding the side surface and electrically connected to the second type doped semiconductor layer and directly contacting the second type doped semiconductor layer on a portion of the side surface, wherein the normal vector of the first surface is different from the normal vector of the side surface and a length of a diagonal of the micro light-emitting diode chip is greater than 1 micrometer and is less than or equal to 140 micrometers and a thickness of the micro light-emitting diode chip is great than 1 micrometer and is less than 10 micrometers, and wherein the first surface faces to the circuit board.

8. The micro light-emitting diode chip display according to claim 7, wherein each of the plurality of micro light-emitting diode chips further comprises an insulating layer, disposed on the first surface and part of the side surface, wherein the insulating layer includes an opening to expose the first type doped semiconductor layer.

9. The micro light-emitting diode chip display according to claim 8, wherein the insulating layer is configured to electrically isolate the first type doped semiconductor layer and the second electrode, and electrically isolate the light emitting layer and the second electrode.

10. The micro light-emitting diode chip display according to claim 7, wherein a ratio of a width of the light emitting layer to a width of the second surface is greater than 0.9 and is less than or equal to 1.

11. The micro light-emitting diode chip display according to claim 7, wherein the epitaxial structure is in the shape of cylinder.

12. The micro light-emitting diode chip display according to claim 7, wherein the circuit board includes a plurality of pixel electrodes and a plurality of common electrodes, the first electrode is bonded to one of the plurality of pixel electrodes and the second electrode is bonded to one of the plurality of common electrodes.

13. The micro light-emitting diode chip display according to claim 12, further comprising a conductive adhesive electrically connecting the second electrode to one of the plurality of common electrodes.

14. The micro light-emitting diode chip display according to claim 13, wherein at least two of the plurality of micro light-emitting diode chips are bonded to the circuit board through the conductive adhesive.

15. The micro light-emitting diode chip display according to claim 14, wherein the conductive adhesive is disposed between the at least two of the plurality of micro light-emitting diode chips and the one of the plurality of common electrodes.

16. The micro light-emitting diode chip display according to claim 13, wherein the conductive adhesive is silver epoxy, or silver paste.

* * * * *